(12) United States Patent
Tschanz et al.

(10) Patent No.: US 6,608,513 B2
(45) Date of Patent: Aug. 19, 2003

(54) FLIP-FLOP CIRCUIT HAVING DUAL-EDGE TRIGGERED PULSE GENERATOR

(75) Inventors: James W. Tschanz, Hillsboro, OR (US); Siva G. Narendra, Beaverton, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/820,579

(22) Filed: Mar. 28, 2001

(65) Prior Publication Data

US 2002/0140481 A1 Oct. 3, 2002

(51) Int. Cl.[7] .................................................. H03K 3/12
(52) U.S. Cl. ........................ 327/218; 327/166; 327/171; 327/199
(58) Field of Search ................................ 327/291, 293, 327/294, 298, 299, 261, 276, 278, 285, 287, 108, 166, 202, 218, 171; 365/230.08, 233, 233.05; 326/82, 83, 94–98, 27, 28; 307/412

(56) References Cited

U.S. PATENT DOCUMENTS

| | | | | |
|---|---|---|---|---|
| 5,552,738 A | * | 9/1996 | Ko | 327/203 |
| 5,633,833 A | * | 5/1997 | Yoon | 365/230.08 |
| 6,147,512 A | * | 11/2000 | Sung et al. | 326/82 |
| 6,242,940 B1 | * | 6/2001 | Na | 326/21 |
| 6,348,825 B1 | * | 2/2002 | Galbi et al. | 327/218 |

* cited by examiner

*Primary Examiner*—Minh Nguyen
(74) *Attorney, Agent, or Firm*—Fish & Richardson P.C.

(57) ABSTRACT

A pulse generator system includes a plurality of buffers at least two transmission gates. The inverters successively and input insert delays into an signal having a series of pulses, each pulse having first and second edges. The transmission gates are operatively coupled to the inverters. The first transmission gate selectively passes the input signal. The second transmission gape selectively passes inverted signal of the input signal.

7 Claims, 5 Drawing Sheets

FLIP-FLOP CIRCUIT HAVING DUAL-EDGE TRIGGERED PULSE GENERATOR

BACKGROUND

This invention relates to a dual edge-triggered circuit, and more particularly to an explicit pulse generator circuit.

Dual edge-triggered circuits latch data on both the rising and falling edges of the clock. This may halve the clock frequency for the same data throughput. Since the power dissipation may be proportional to the frequency of operation, the total used power may be reduced. Further, since a significant portion of the total power of the circuit may be consumed in the clock distribution network, it may be advantageous to employ chips that operate on both edges of the clock. Thus, replacing conventional single edge-triggered circuits with dual edge-triggered circuit may result in up to 50% power savings in the clock distribution. However, the circuits must be designed in an energy-efficient manner to provide meaningful reduction in the total power consumption.

Prior art designs on creating dual edge-triggered flip-flops have been provided by replicating the latch elements of a single edge-triggered flip-flop and multiplexing the outputs. For example, M. Afghahi and J. Yuan, in "Double Edge-Triggered D-Flip-Flops for High-Speed CMOS Circuits", IEEE Journal of Solid-State Circuits, pages 1168–1170, Vol. 26, No. 8, August 1991, suggest reducing the power dissipation of a clock distribution circuit by using flip-flops triggered on both edges of the clock pulses instead of on only one edge. The dual edge-triggered flip-flop is created from two true single-phase clock elements and a NAND gate. A. Gago et. al., in "Reduced implementation of D-type DET Flip-Flops", IEEE Journal of Solid-State Circuits, pages 400–402, Vol. 28, No. 3, March 1993, present a dual edge-triggered static master-slave flip-flop. The design duplicates a single edge-triggered flip-flop but shares the clock transistors that are common to both latches. These implementations suffer from a larger clock load at the same level of performance as a single edge-triggered flip-flop. Therefore, this may offset gain from the reduced clock frequency.

SUMMARY

In an embodiment, flip-flop device may include a transmission gate to receive data and, in response to control signals, to pass the data, a buffer coupled to an output of the first transmission gate to save and output the data, and a dual edge triggered pulse generator. The dual edge triggered pulse generator may receive a input clock signal having a frequency and a pulse width and generate the control signals as a function of the input clock signal. The control signals may have a frequency equal to twice the input clock signal frequency. The control signals may enable the first transmission gate to pass the data for a time duration less than one-half of the input clock signal pulse width so that a slave latch for latching the data is not required.

The dual edge triggered pulse generator may include two or more inverters connected in series, each inverter to successively insert a delay into the input clock signal and to generate a delay signal, and additional transmission gates, responsive to the delay signal and coupled to said at least two inverters, where the outputs of the additional transmission gates may be coupled together. One of the transmission gates may be coupled to receive and selectively pass the input clock signal as a second output signal having a delay time less than the input clock signal pulse width. Another of the transmission gates may be coupled to receive and selectively pass inverted signal of the input clock signal as a third output signal having a delay time less than the input clock signal pulse width. The second output signal and the third output signal may combine at the transmission gate outputs to form an output clock signal having two pulses within one cycle of the input clock signal.

DESCRIPTION OF DRAWINGS

These and other features and advantages of the invention will become more apparent upon reading the following detailed description and upon reference to the accompanying drawings.

DETAILED DESCRIPTION

In recognition of the above-described difficulties with conventional dual edge-triggered circuits, the present disclosure describes an explicit pulse generator that provides a dual edge-triggered signal. The explicit pulse dual edge-triggered circuit provides advantages over a conventional dual edge-triggered circuit by allowing larger energy savings from fewer device count and reduced clock load.

Figure 1:
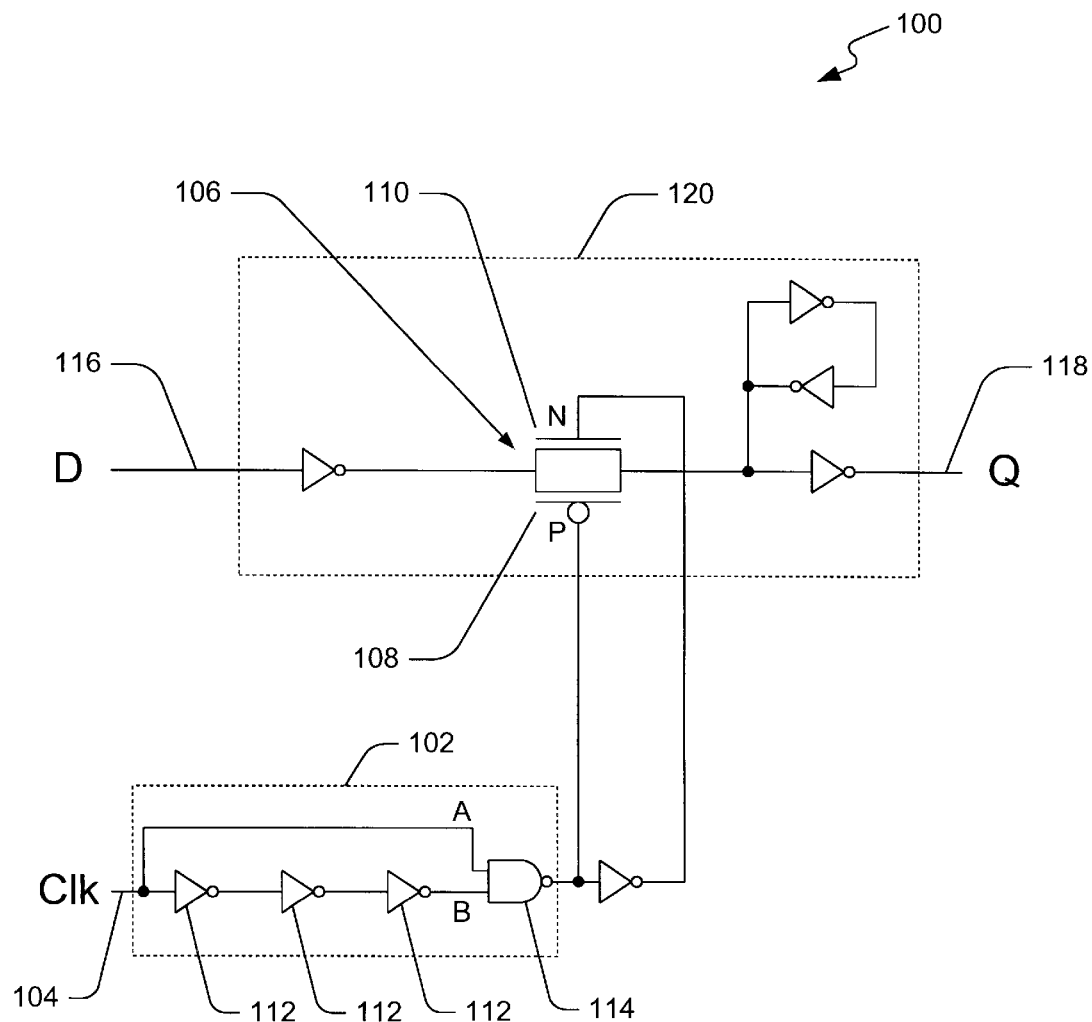
FIG. 1 shows an explicit-pulsed static flip-flop element according to an embodiment of the present disclosure.

An explicit-pulsed static flip-flop element 100 according to an embodiment is shown in FIG. 1. The flip-flop element 100 includes an explicit pulse generator 102 and a flip-flop portion 120. This element 100 is a single edge-triggered flip-flop.

In the illustrated embodiment, the rising edge on the "Clk" input 104 produces a falling clock pulse on the PMOS transistor 108 of the transmission gate 106. The "Clk" input 104 also produces a rising clock pulse on the NMOS transistor 110 of the transmission gate 106. The width of the clock pulse, produced at the output of the explicit pulse generator 102, may be set by the number and sizes of inverters 112. Thus, the clock pulse may be set to achieve a reasonable balance between the amount of time borrowing desired and the maximum hold time that may be tolerated. Although no pulse is generated on the falling edge of the incoming clock, power is dissipated in the pulse generator 102 as the inverters 112 switch.

Figure 2:
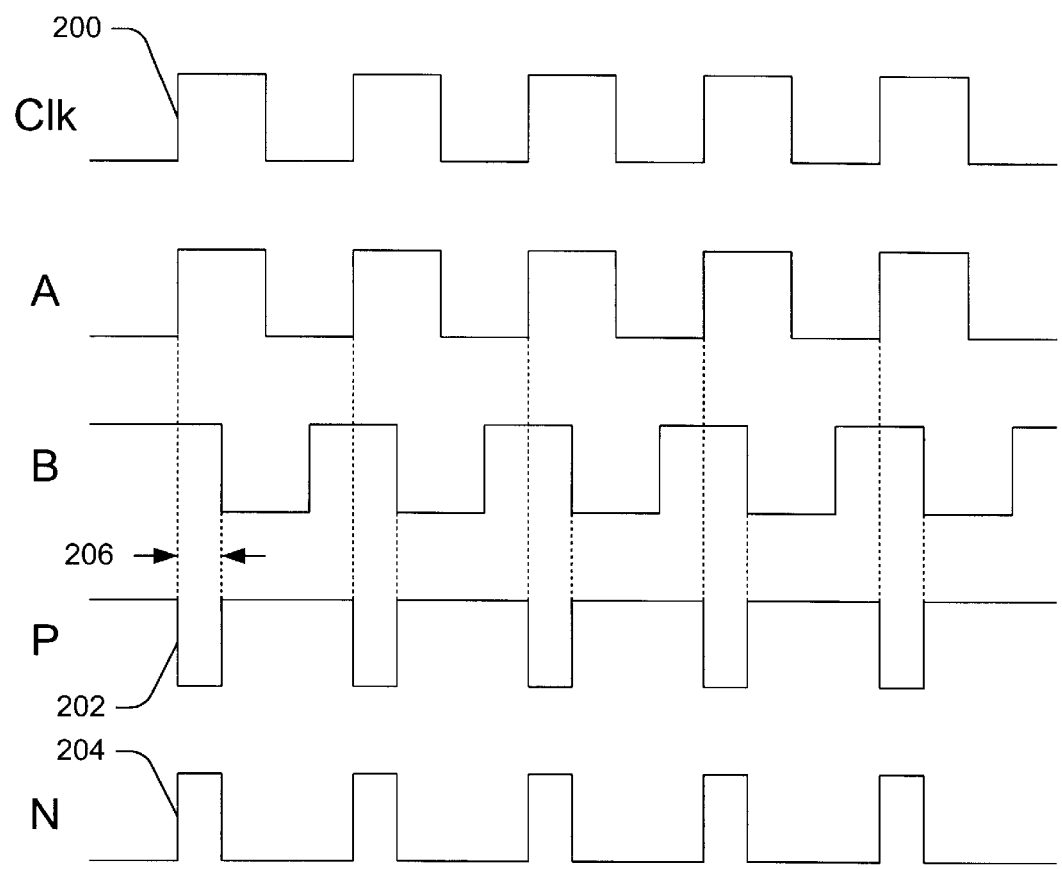
FIG. 2 shows a timing diagram of the explicit pulse generator shown in FIG. 1.

FIG. 2 shows a timing diagram of the explicit pulse generator 102 shown in FIG. 1. The timing diagram shows that the rising edge 200 on the Clk input produces a falling clock pulse 202 on the PMOS transistor 108 (node P) and a rising clock pulse 204 on the NMOS transistor 110 (node N). The pulses 202, 204 are generated when the input node B of the NAND gate 114 is delayed with respect to the input node A by the inverters 112. The NAND gate 114 outputs a falling edge pulse at node P, in response to the rising edge of the Clk input, when the input nodes A and B are both logic high. Therefore, the pulse width 206 is set by the delay generated by the inverters 112. Accordingly, the rising edge clock pulse 204 at the NMOS transistor 110 and the falling edge clock pulse 202 at the PMOS transistor 108 of the transmission gate 106 clocks data input D 116 to output Q 118 of the flip-flop.

Figure 3:
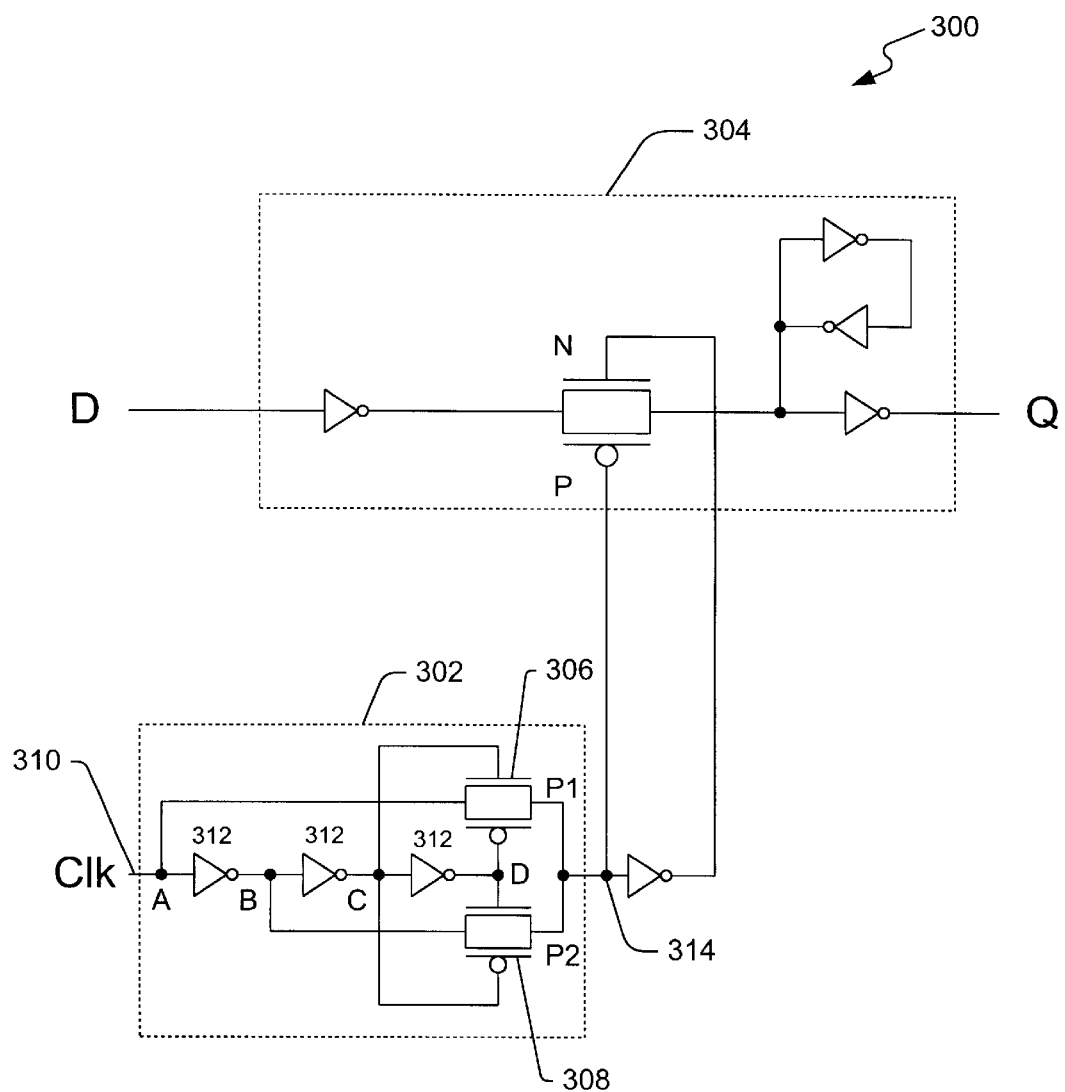
FIG. 3 illustrates one embodiment of a dual edge-triggered explicit-pulsed static flip-flop element.

One embodiment of a dual edge-triggered explicit-pulsed static flip-flop element 300 is illustrated in FIG. 3. The dual edge-triggered element 300 includes an explicit pulse generator system 302. The element 300 also includes a flip-flop portion 304 having the same design as the flip-flop portion 120 of the single edge-triggered element 100 shown in FIG. 1.

The explicit pulse generator system 302 includes a transmission-gate XOR circuit involving two transmission gates 306, 308. The transmission-gate XOR circuit provides a clock pulse generated on both edges of the incoming clock 310.

Since the flip-flop portion 304 has not been modified, there is no performance penalty for the dual edge-triggered design as compared to the single edge-triggered version. Further, since no replication is necessary, the total area of the dual edge-triggered element 300 may be smaller than the conventional dual edge-triggered design.

In the illustrated embodiment of the explicit pulse generator system 302 shown in FIG. 3, there are three inverters 312 and two transmission gates 306, 308. Each of the transmission gates 306, 308 includes a PMOS transistor and an NMOS transistor connected in parallel. The transistors in the transmission gate are controlled by a pair of complementary signals driving the gates of the transistors. For example, the transmission gate 306 is controlled by delayed signals, at nodes C and D, feeding the gate terminals of the NMOS and PMOS transistors, respectively. The transmission gate 308 is controlled by delayed signals, at nodes D and C, feeding the gate terminals of the NMOS and PMOS transistors, respectively. Input signals to the transmission gates 306, 308 are supplied by the input signal at node A and the delayed signal at node B, respectively. The outputs of the transmission gates 306, 308 are tied together to form a wired-OR configuration at node 314.

Figure 4:
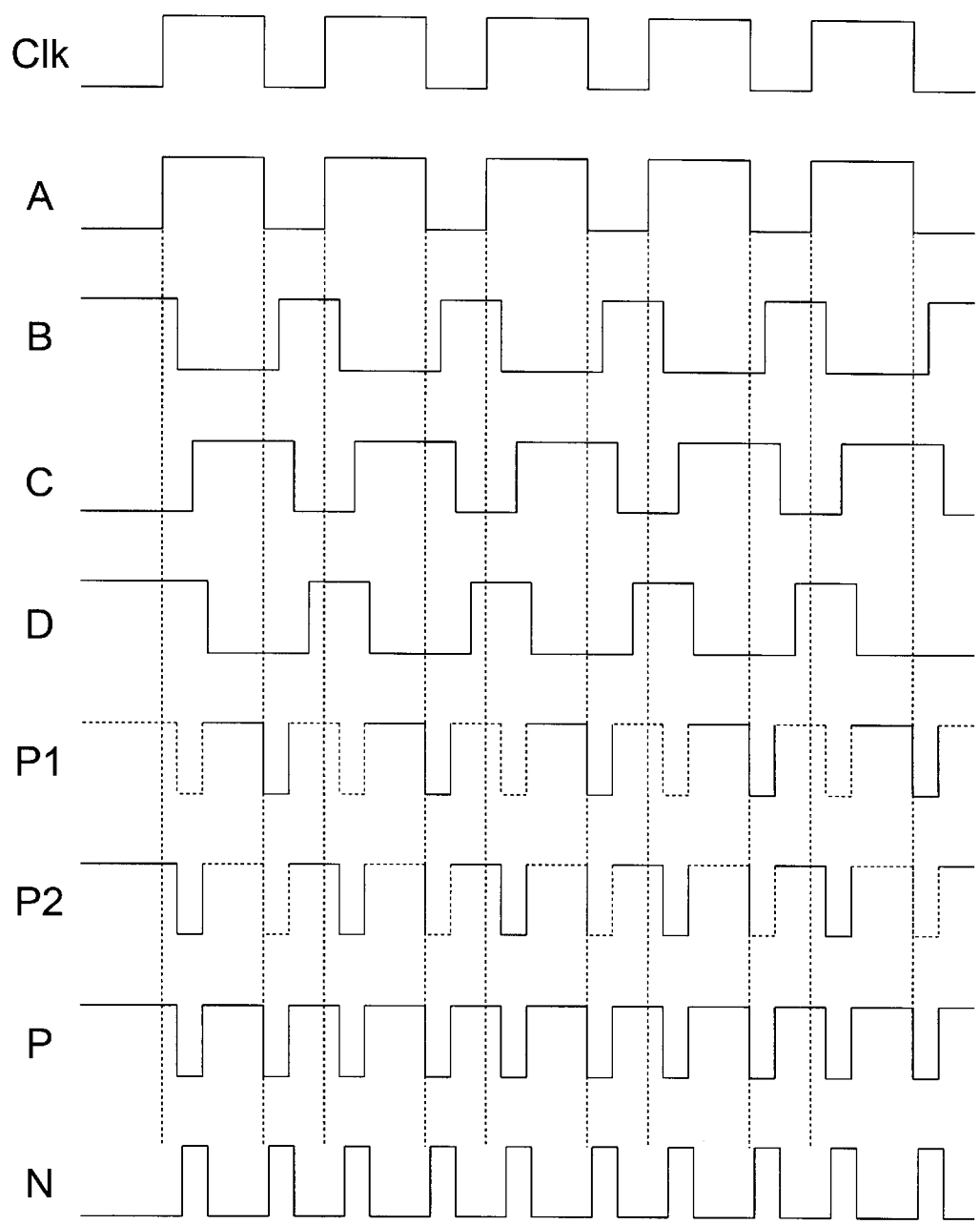
FIG. 4 shows a timing diagram of the explicit pulse generator shown in FIG. 3.

FIG. 4 shows a timing diagram of the explicit pulse generator system 302 shown in FIG. 3. The delayed clock pulses at nodes A through D are shown below the input clock pulse ("Clk"). The transmission gate 306 passes the input clock to the output node P1, when the pulse at node C is at logic high and the pulse at node D is at logic low. The transmission gate 308 passes the delayed pulse at node B to the output node P2, when the pulse at node D is at logic high and the pulse at node C is at logic low. Therefore at node P1, a falling clock pulse (indicated by solid line) is generated at the falling edge of the input clock 310. At node P2, a falling clock pulse (indicated by solid line) is generated at the falling edge of the signal at node B. This signal may be a delayed rising edge of the input clock 310.

Accordingly, falling clock pulses are generated at both edges of the input clock at node P, as shown in FIG. 4. Rising clock pulses are generated at both edges of the input clock at node N.

Figure 5:
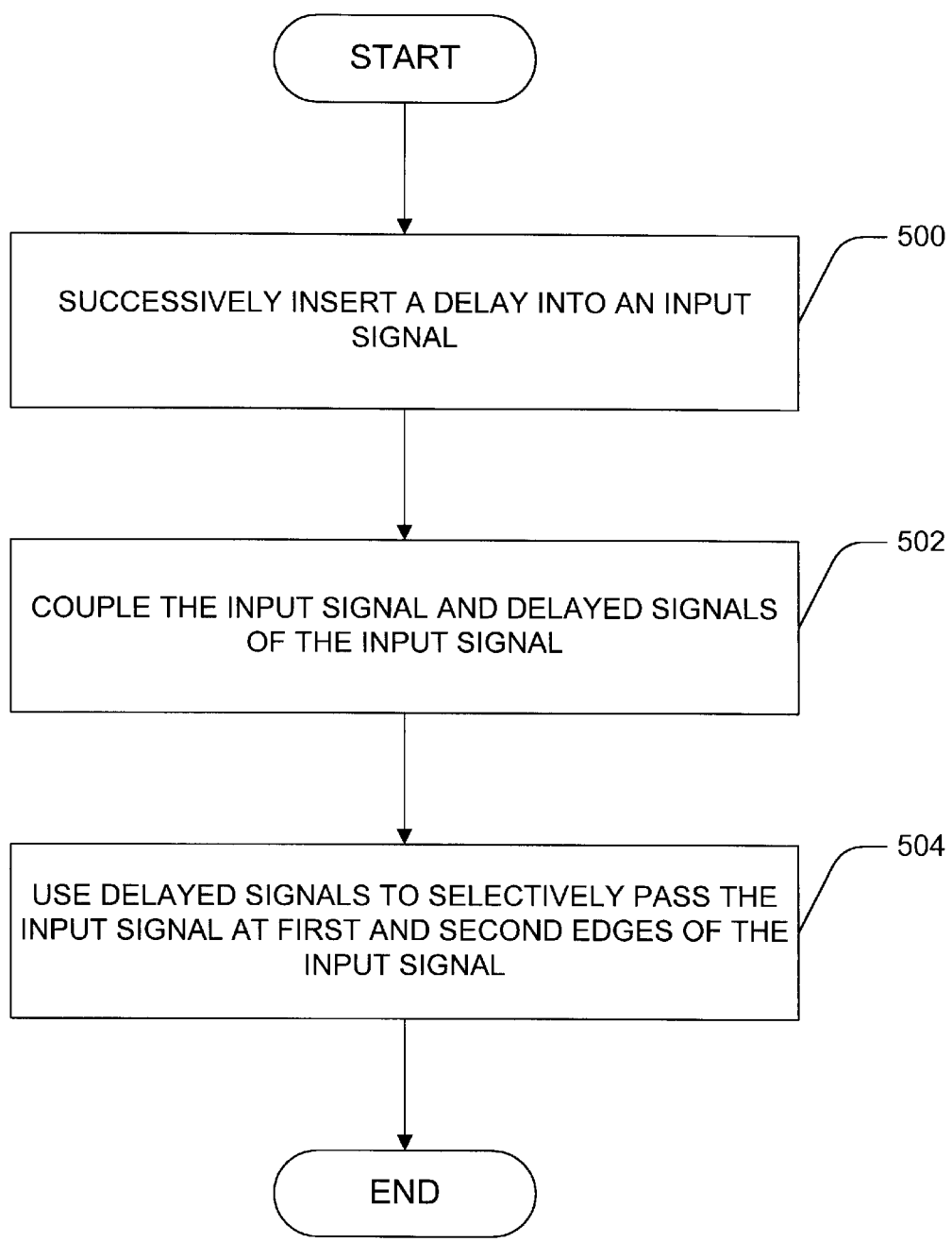
FIG. 5 shows a method for generating explicit pulse signals.

FIG. 5 shows a method for generating explicit pulse signals. The method includes successively inserting a delay into an input signal, at 500. The input signal and delayed signals of the input signal are then coupled, at 502. At 504, the input signal is selectively passed at first and second edges of the input signal by using delayed signals.

The advantages of using an explicit pulse generator similar to the generator system 302 shown in FIG. 3 have been measured. For a target D-to-Q delay of 100 picoseconds, the explicit-pulsed dual edge-triggered flip-flop element was measured to consume less energy than the single edge-triggered version. Additional energy savings may be realized in the clock distribution network.

While specific embodiments of the invention have been illustrated and described, other embodiments and variations are possible. For example, although the illustrated embodiments show the pulse generator being used in a flip-flop circuit, other circuits are envisioned that utilize the explicit pulse generator. Furthermore, the clock signal generated by the explicit pulse generator may be used for purposes other than for clocking. Thus, the pulse generator may be used in transition encoders for low-power busses, or in frequency doubler circuits.

All these are intended to be encompassed by the following claims.

What is claimed is:

1. A method, comprising:

successively inserting a delay into an input clock signal having a frequency and a pulse width, to generate delayed signals;

using the delayed signals to selectively pass the input clock signal at first and second edges of the input clock signal to form first and second output signals;

combining the first and second output signals to generate an output clock signal having a frequency twice the input clock signal frequency and a pulse width less than one-half the input clock signal pulse width; and controlling a transmission gate, in response to the output clock signal, to selectively pass and latch data.

2. The method of claim 1, wherein said selectively passing includes first passing a first logic level of the input clock signal responsive to the first edge of the input clock signal, and second passing a second logic level of the input clock signal responsive to the second edge of the input clock signal, after a delay.

3. The method of claim 2, wherein said selectively passing further includes third passing the first logic level of the input clock signal responsive to the second edge of the input clock signal, and fourth passing the second logic level on the first edge of the input clock signal, after the delay.

4. The method of claim 3, wherein said selectively passing further includes connecting outputs of said first, second, third, and fourth passings to selectively pass the input clock signal, such that said first, second, third, and fourth passings produce an output signal having at least two pulses within one cycle of the input clock signal.

5. A flip-flop device, comprising:

a first transmission gate to receive data and, in response to control signals, to pass the data;

a buffer coupled to an output of the first transmission gate to save and output the data; and a dual edge triggered pulse generator to receive an input clock signal having a frequency and a pulse width, and to generate the control signals as a function of the input clock signal, the control signals having a frequency equal to twice the input clock signal frequency, the control signals to enable the first transmission gate to pass the data for a time duration less than one-half of the input clock signal pulse width so that a slave latch for latching the data is not required, the dual edge triggered pulse generator comprising:

at least two inverters connected in series, each inverter to successively insert a delay into the input clock signal and to generate a delay signal;

at least second and third transmission gates, responsive to the delay signal and coupled to said at least two inverters, outputs of the at lead second and third transmission gates coupled together;

said second transmission gate coupled to receive and selectively pass the input clock signal as a second output signal having a delay time less than the input clock signal pulse width;

said third transmission gate coupled to receive and selectively pass inverted signal of the input clock signal as a third output signal having a delay time less than the input clock signal pulse width; and the second output signal and the third output signal to combine at the second and third transmission gate outputs to form an output clock signal having two pulses within one cycle of the input clock signal.

6. The device of claim 5, further comprising:

an inverter coupled to the outputs of said second and third transmission gates, said inverter providing an inverted delayed signal of said output clock signal.

7. The device of claim 6, wherein said output clock signal and said inverted delayed signal of said output clock signal are the control signals to control selection in said first transmission gate.

* * * * *